(12) United States Patent
Pai et al.

(10) Patent No.: US 7,769,730 B2
(45) Date of Patent: Aug. 3, 2010

(54) METHOD AND SYSTEM FOR DATA COMPRESSION AND DECOMPRESSION

(75) Inventors: Ravi R. Pai, Bangalore (IN); Barsha Baruah, Bangalore (IN); Mark Pereira, Bangalore (IN)

(73) Assignee: SoftJin Technologies Private Limited, Bangalore, Karnataka (IN)

( * ) Notice: Subject to any disclaimer, the term of this patent is extended or adjusted under 35 U.S.C. 154(b) by 361 days.

(21) Appl. No.: 11/912,151

(22) PCT Filed: Oct. 19, 2006

(86) PCT No.: PCT/IN2006/000411

§ 371 (c)(1),
(2), (4) Date: Oct. 22, 2007

(87) PCT Pub. No.: WO2007/049297

PCT Pub. Date: May 3, 2007

(65) Prior Publication Data

US 2008/0183739 A1    Jul. 31, 2008

(30) Foreign Application Priority Data

Oct. 24, 2005    (IN)    .................. 1539/CHE/2005

(51) Int. Cl.
*G06F 7/00* (2006.01)
*G06F 17/00* (2006.01)

(52) U.S. Cl. .................................................. 707/693
(58) Field of Classification Search ............... None
See application file for complete search history.

(56) References Cited

U.S. PATENT DOCUMENTS

| 7,110,547 B2 * | 9/2006 | Short .......................... 380/263 |
| 2003/0025703 A1 * | 2/2003 | Osher et al. .................. 345/555 |

* cited by examiner

*Primary Examiner*—Kuen S Lu
*Assistant Examiner*—Tuan Pham
(74) *Attorney, Agent, or Firm*—Prakash Nama; Global IP Services, PLLC

(57) ABSTRACT

The present invention provides a method and system for lossless manipulation of a data file size. The method comprises receiving the data file in an original format (205) and performing an action (210) of compression (215) or decompression (220) on the data file. The data file can be compressed or decompressed using a transliteration procedure. The present invention also provides a method for compressing or decompressing a data file using an abbreviation procedure, as well as a referencing procedure. A method for compressing the data file using any combination of the transliteration procedure, the abbreviation procedure and the referencing procedure is provided. The present invention further provides a system for performing compression or decompression on a data file based on the transliteration procedure, the abbreviation procedure and the referencing procedure.

4 Claims, 11 Drawing Sheets

METHOD AND SYSTEM FOR DATA COMPRESSION AND DECOMPRESSION

RELATED APPLICATION DATA

This application is a complete patent application in relation of Indian Patent Application Serial No. 1539/CHE/2005 filed on Oct. 24, 2005 entitled "Method for IC Layout and Mask Data Compressed and Decompression."

FIELD OF THE INVENTION

The present invention generally relates to manipulating a size of a data file. More specifically, the present invention relates to a lossless recoverable compression and decompression of a data file.

BACKGROUND OF THE INVENTION

Existing methods and systems for manipulating the size of a data file include encoding schemes for encoding information of the data file using fewer information bearing units. The information in the data file is considered to be generic data during encoding. The generic data is in the form of bits and bytes. A compressor used for encoding does not make a distinction between various characteristics of data while encoding. The distinction between various characteristics of the data can be more effective based on various inherent characteristics of the data.

Many of the existing compressors provide either a lossless compression or a lossy compression. The lossless compression can recover the original data completely through a decompression technique. The lossy compression results in some loss of data to achieve a higher compression. This results in non-recovery of the original data through any decompression technique.

Another existing method for encoding is a GDSII compression. The GDSII compression is based on generic off-the shelf compression techniques that are used in generic compression tools. Some of the generic compression tools that provide lossless compression, but are not limited to, are gzip and bzip2. Both the methods employ the repetition of patterns to compress an input data.

The gzip compression tool is based on a deflation algorithm. Duplicated strings are located in the input data. The duplicate strings in the input data are replaced by a pointer to a previous string. The pointer is in the form of a pair that may restrict the distance of the string to 32K bytes and may limit the length of the string to 258 bytes. The string is emitted as a sequence of literal bytes if the duplicate string does not appear in the restricted distance or the limited length. Also, additional methods for compressing the input data compress a generic sequence of bytes based on a dictionary approach.

The bzip2 tool is based on a Burrows-Wheeler Transform algorithm and Huffman coding. The bzip2 tool applies a reversible transformation to the input data. The reversible transformation allows an easier compression of the input data using a second algorithm. The second algorithm can include Huffman or Arithmetic coding. Blocks of input data are transformed using the algorithm instead of a sequence of the input data. A transformed block includes identical characters as present in the original block. Similar characters are grouped together in the transformed block. This provides for a simpler method to compress the input data using the second algorithm. Both the methods do not make use of known binary formats with specific grammar rules and structures for compressing the input data.

Therefore, there is a need for a method and system for compressing the input data using a repetition pattern along with specific grammar rules and structures.

SUMMARY OF THE INVENTION

An aspect of the present invention is to provide a method for lossless manipulation of a data file size corresponding to a data file.

Another aspect of the present invention is to provide a method for performing a compressing action or a decompressing action on a data file using a transliteration procedure. The method comprises receiving the data file in an original format. In response to receiving the data file, an action is performed on the data file. In an embodiment of the present invention, the action can be a compressing action such that the data file is compressed using the transliteration procedure to obtain a compressed data file. The action can also be a decompressing action such that the data file is decompressed using the transliteration procedure to obtain a decompressed data file.

Yet another aspect of the present invention is to provide a method for managing a data file size of a data file using an abbreviation procedure. The method comprises fragmenting the data file into a plurality of original format modules. These plurality of original format modules are compressed using an abbreviation procedure to obtain a corresponding plurality of compressed format modules. The method further comprises combining the plurality of compressed format modules to obtain a compressed data file.

Yet another aspect of the present invention provides a referencing procedure. The referencing procedure comprises maintaining an adaptive library corresponding to the data file. The data file can comprise a plurality of original format modules or a plurality of transliterated format modules or a plurality of abbreviated modules. The plurality of transliterated format modules can be one or more original format modules that are transliterated. The plurality of abbreviated modules can comprise one or more original format modules or one or more transliterated format modules that are abbreviated. The adaptive library comprises locations corresponding to a plurality of original format modules or a plurality of transliterated format modules or a plurality of abbreviated modules in the data file.

In another aspect of the present invention, the transliteration procedure, the abbreviation procedure and the referencing procedure are combined to compress a data file.

Further, an aspect of the present invention is to provide a computer program product comprising a computer usable medium having a computer readable program for managing a data file size corresponding to a data file.

BRIEF DESCRIPTION OF THE DRAWINGS

The foregoing objects and advantages of the present invention, which provides a method for of lossless manipulation of a size of a data file, may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
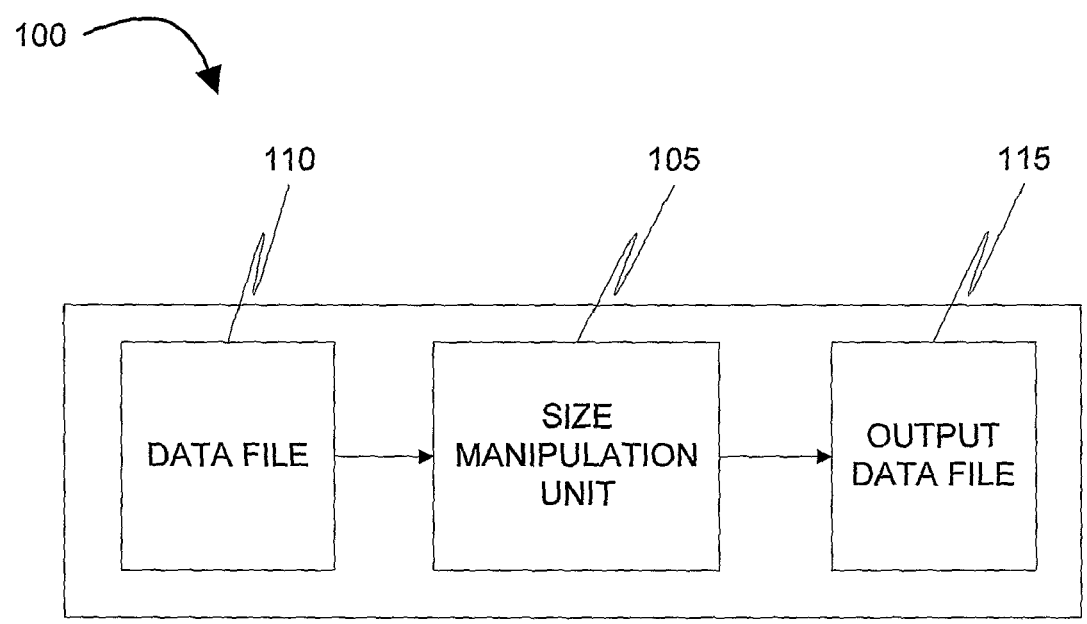
FIG. 1 illustrates an exemplary system for manipulating sizes of one or more data files in accordance with an embodiment of the present invention.

Before describing in detail embodiments that are in accordance with the present invention, it should be observed that the embodiments reside primarily in combinations of method steps and system components for manipulation of a data file size corresponding to a data file. Accordingly, the system components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Relative terms such as first and second, top and bottom, and the like may be used solely to distinguish one entity or action from another entity or action without necessarily requiring or implying any actual such relationship or order between such entities or actions. The terms "comprises", "comprising", "has", "having", "includes", "including", "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. A device or structure that is "configured" in a certain way is configured in at least that way, but may also be configured in ways that are not listed.

Generally speaking, pursuant to the various embodiments, the present invention provides methods and a system for perfectly recoverable compression and decompression of a data file. The data file can comprise a layout data or a mask data for integrated circuits (ICs). The format of the data file can be, but is not limited to, a Graphic Design System II (GDSII), Open Artwork System Interchange Standard (OASIS), Manufacturing Electron Beam Engraving System (MEBES), JEOL, Hitachi Language (HL), Variable Shaped Beam-11/12 (VSB-11/12) or Open Artwork System Interchange Standard-Variable Shaped Beam (OASIS-VSB).

Turning now to FIG. 1, an exemplary system for manipulating sizes of one or more data files is illustrated in accordance with an embodiment of the present invention. A system 100 comprises a size manipulation unit 105 and a data file 110. Those skilled in the art will realize that there can be one or more data files in system 100 and all such embodiments fall within the scope of the present invention. Size manipulation unit 105 is configured for manipulating size of data file 110. Size manipulation unit 105 either compresses or decompresses the data files present in the system 100 based on a predefined criterion. The predefined criterion specifies if data file 110 needs to be compressed or decompressed. Further, the predefined criteria can also enable a user to choose a method of compression or decompression. In accordance with the present invention, methods of compression or decompression can be based on a transliteration procedure, an abbreviation procedure or a combination of at least two of the transliteration procedure, the abbreviation procedure and a referencing procedure. The compression and decompression using the transliteration procedure are described in conjunction with FIG. 3 and FIG. 4 respectively. Further, the abbreviation procedure for compression and decompression are described in conjunction with FIG. 5 and FIG. 6 respectively. The methods combining at least two of the transliteration procedure, the abbreviation procedure and a referencing procedure for compression and decompression are described in conjunction with FIG. 7, FIG. 8 and FIGS. 9A and 9B.

For instance, if a user wants data file 110 to be compressed using a transliteration procedure, size manipulation unit 105 can manipulate data file 110 such that data file 110 is compressed using the transliteration procedure to obtain an output data file 115. In this case output data file 115 is a compressed version of data file 110. In another instance, data file 110 can already be in a compressed format based on, for example, the abbreviation procedure. In this case, size manipulation unit 105 can decompresses data file 110 based on the abbreviation procedure to obtain output data file 115. Those skilled in the art will realize that in this case, output data file 115 is a decompressed version of data file 110.

Figure 2:
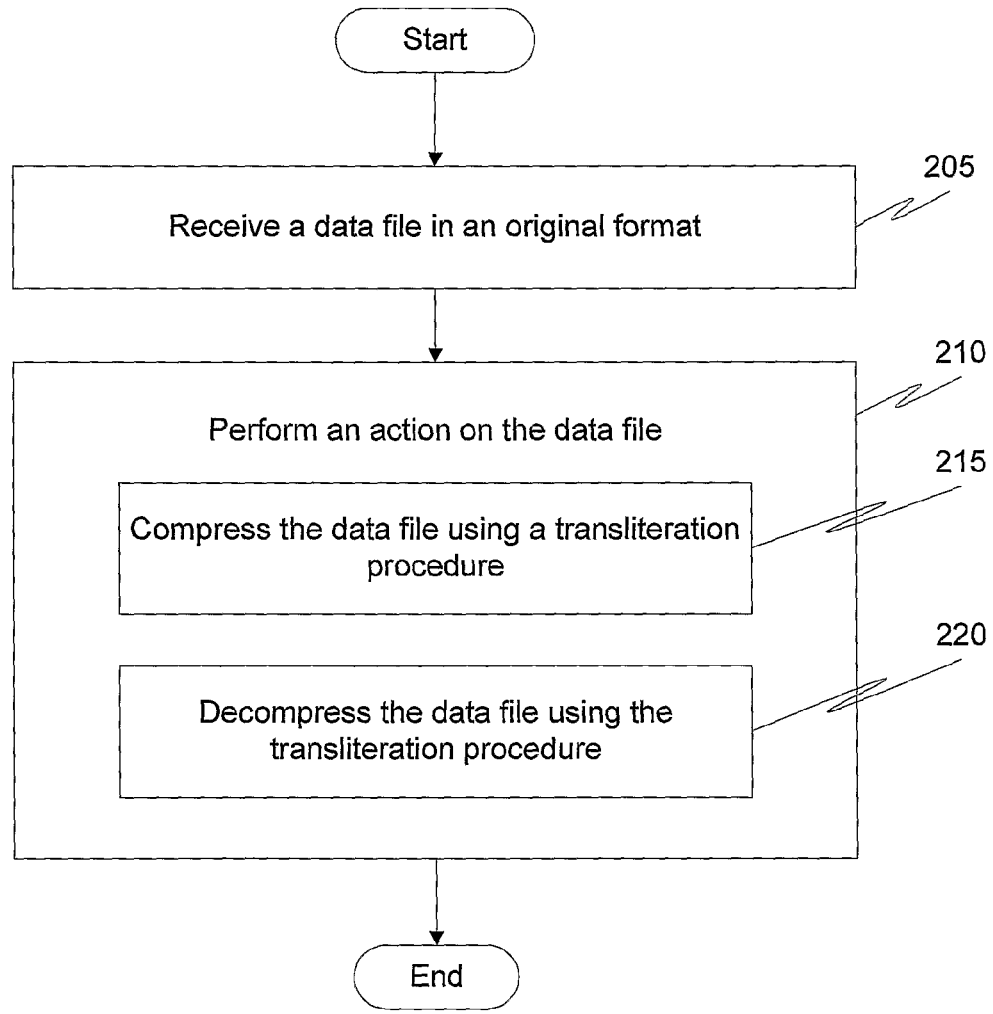
FIG. 2 illustrates a flow diagram for a method of lossless manipulation of a data file size corresponding to a data file in accordance with an embodiment of the present invention.

Turning now to FIG. 2, a flow diagram for a method of lossless manipulation of a data file size corresponding to a data file is shown in accordance with an embodiment of the present invention. Referring back to FIG. 1, data file 110 is received at step 205. Data file 110 can comprise IC design layout or mask data. Data file 110 is in an original format.

In response to receiving data file 110, an action is performed on data file 110 at step 210. The action can comprise compressing data file 110 at step 215. In this case, the original format of data file 110 can be, but is not limited to, a Graphic Design System II (GDSII), Open Artwork System Interchange Standard (OASIS), Manufacturing Electron Beam Engraving System (MEBES), JEOL, Hitachi Language (HL), Variable Shaped Beam-11/12 (VSB-11/12) or Open Artwork System Interchange Standard-Variable Shaped Beam (OA- SIS-VSB). Those skilled in the art will realize that data file 110 can comprise a geometrical data such as coordinates of a polygon.

In accordance with the embodiment depicted in FIG. 2, data file 110 is compressed using a transliteration procedure to obtain output data file 115. Output data file 115 is a compressed version of data file 110 and will hereinafter be referred to as a compressed data file. The compressed data file is in a compressed format such that a compressed data file size of the compressed data file is less than or equal to size of data file 110. However, those skilled in the art will appreciate that compression methods cannot guarantee compression for all data files. In other words, for any (lossless) data compression methods, there will be a data file that does not get smaller when processed by the compression method. Nonetheless, an "escape" facility can be used in practice to turn off the normal compression procedure for data files that can become larger in size if the normal compression procedure was used. The method for compressing data file 110 using the transliteration procedure is further explained in detail in conjunction with FIG. 3.

Further, the action can also comprise decompressing data file 110 at step 220. In this case, data file 110 can already be in a compressed format. In accordance with the embodiment, depicted in FIG. 2, data file 110 can be decompressed using the transliteration procedure to obtain an output data file 115. Output data file 115 is a decompressed version of data file 110 and output data file 115 will hereinafter be referred to as a decompressed data file. The decompressed data file is in a decompressed format such that a decompressed data file size is more than or equal to size of data file 110. In this case, the decompressed format can be, but is not limited to, a Graphic Design System II (GDSII), Open Artwork System Interchange Standard (OASIS), Manufacturing Electron Beam Engraving System (MEBES), JEOL, Hitachi Language (HL), Variable Shaped Beam-11/12 (VSB-11/12) or Open Artwork System Interchange Standard-Variable Shaped Beam (OASIS-VSB). The method for decompressing data files is further explained in detail in conjunction with FIG. 4.

Figure 3:
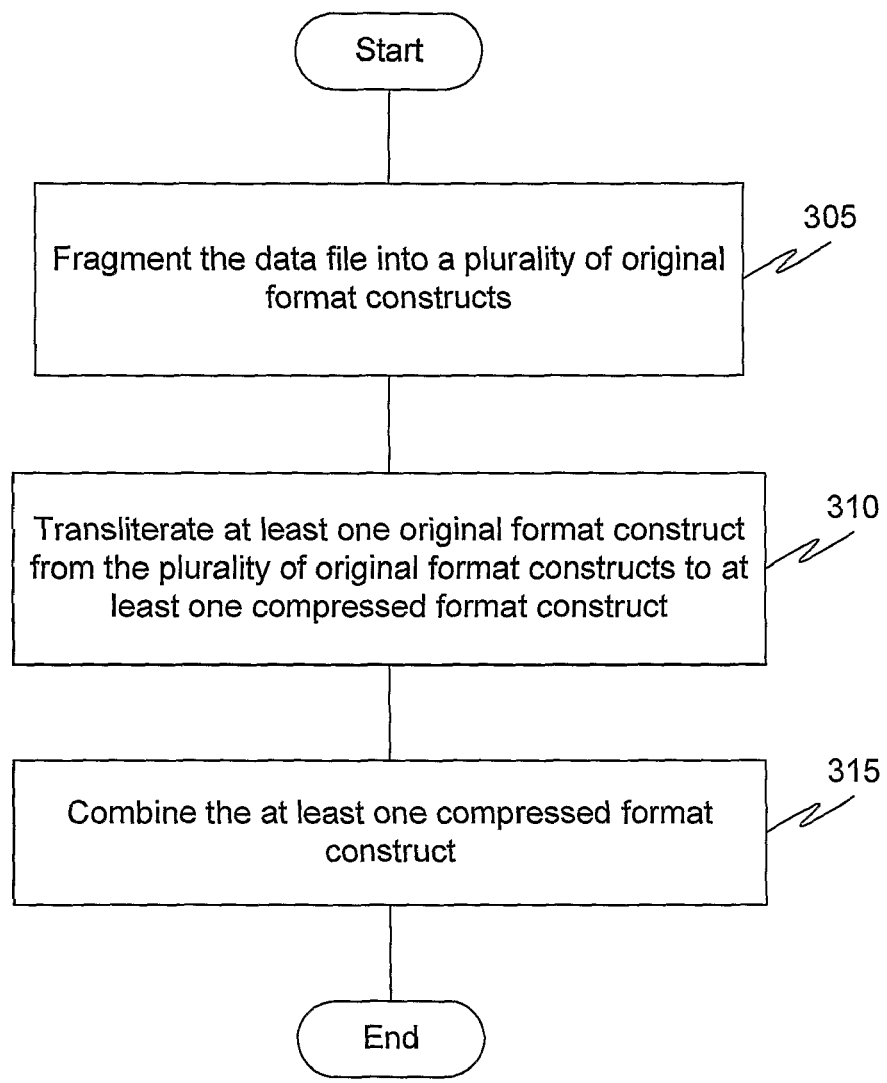
FIG. 3 illustrates a flow diagram for a method of compressing a data file using a transliteration procedure in accordance with an embodiment of the present invention.

Turning now to FIG. 3, a flow diagram for a method of compressing a data file using a transliteration procedure is shown in accordance with an embodiment of the present invention. As described in FIG. 2, in an embodiment of the present invention, data file 110 is compressed using the transliteration procedure to obtain compressed data file at step 215. For this purpose, data file 110, which is in an original format, is fragmented into a plurality of original format constructs at step 305. In an embodiment of the present invention, the plurality of original format constructs can be a plurality of original format modules. Those skilled in the art will appreciate that the granularity of the plurality of original format modules can be an implementation decision. However, in IC design layout or mask data files, easily identifiable units may be identified as the plurality of original format modules. For instance, a structure is considered as an original format module in GDSII. Generally, a module represents a smallest unit of data that can be accessed randomly while decompressing the data.

In another embodiment of the present invention, the plurality of original format constructs are a plurality of original format elements. In this embodiment, the plurality of original format modules are segregated into the plurality of original format elements. Those skilled in the art will appreciate that the granularity of the plurality of original format elements can be an implementation decision. However, usually a layout or a mask data file has easily identifiable units as original format elements. For example, in case of GDSII, an original format element can be an element that fully defines an individual polygon. Generally, an element represents a smallest unit of data that can be decompressed during decompression of the data.

Data file 110 is fragmented into the plurality of original format constructs in a same sequence as they appear in data file 110. Any global data outside the plurality of original format constructs can be passed as globals, for example as a header or other information. Further, some important data can be collected from data file 110 and can be passed on to the next stages through Trailer information. This data can be useful for selective decompression and random access and direct reading of compresses data.

In one embodiment of the present invention, each of the plurality of original format constructs is passed on to the next stage for transliteration. In another embodiment of the present invention, the plurality of original format constructs are filtered to obtain a selected set of original format constructs, which are passed on to the next stage for transliteration. The selected set of original format constructs can be selected from the plurality of original format constructs based on one or more predetermined criterion. The one or more predetermined criterion can comprise selecting or filtering out a specific layer of data file 110, selecting or filtering out a specific original format construct, resizing of one or more geometric data in data file 110 and eliminating at least one self-intersecting geometric data in data file 110.

In an embodiment of the present invention, data file 110 can be filtered using complex filters configured for resizing of polygons or eliminating self-intersecting polygons. Filtering the plurality of original format constructs provides a capability of selective lossless compression to the present invention. However, those skilled in the art will appreciate that if a global data is filtered out, the compression may not be lossless as some important information may be lost along with the global data.

At step 310, the one or more original format constructs from the plurality of the original format constructs is transliterated to one or more compressed format constructs. The one or more compressed format constructs can be compressed format modules or compressed format elements. For instance, if an original format element is compressed, a compressed format element is obtained and if an original format module is compressed, a compressed format module is obtained.

In an embodiment of the present invention, the plurality of original format constructs are transliterated sequentially, that is they are transliterated in the same sequence as they appear in data file 110. In another embodiment of the present invention, where the plurality of original format constructs are filtered to obtain the selected set of original format constructs, only the selected set of original format constructs are compressed.

In an embodiment of the present invention, a new and efficient compressed format is constructed corresponding to the original format. For constructing the compressed format, one or more compressed format constructs are formulated corresponding to the one or more original format constructs such that a one-to-one and a back-and-forth mapping exists between the one or more original format constructs and the one or more compressed format constructs. Those skilled in the art will appreciate that the amount of compression depends on the efficiency of the compressed format as compared to the original format. Specifically, the amount of compression through transliteration is decided by the weighted average amount of reduction of storage space required by the one or more compressed format constructs as compared to the one or more original format constructs.

For instance, the plurality of original format elements can be alphabets in the original format. A compressed format element is formulated corresponding to each alphabet in the original format. If there is a one-to-one and a back-and-forth mapping between the compressed format element and the alphabet in the original format, transliteration from the compressed format to the original format can produce an exact original data file in the original format. Those skilled in the art will realize that any automatic text reader which can read data file 110 alphabet-wise and interpret the content can also read the compressed data file directly as long as the interpreter is suitably modified to read the plurality of compressed format constructs. For example, if the original format is the English language then the compressed format can be the Greek language, if the alphabets of the Greek language, such as $\alpha$, $\beta$, $\gamma$ and $\delta$, take less storage space than the corresponding alphabets, a, b, c and d, of the English language.

The transliteration procedure for compression imitates the transliteration for textual data as described in the example above, but applies the same process for different applications such as a layout or a mask data. In case of layout or mask data compression, the transliteration procedure is done at the level of basic source format or language construct, which can be considered analogous to the alphabets in the text data.

Upon transliterating the one or more original format constructs, the one or more compressed format constructs are obtained. The one or more compressed format constructs are combined sequentially at step 315 to obtain the compressed data file corresponding to data file 110.

If the one or more compressed format constructs are compressed format elements, the compressed format elements are collected sequentially to form a plurality of compressed format modules. In an embodiment of the present invention, zero or more of this plurality of compressed format modules can further be compressed using a generic compressing procedure to obtain zero or more generically compressed format modules. The generic compression procedure can be any compression procedure used conventionally for compressing data files. For example, the generic compression procedure can be based on but not limited to zip, gzip, bzip2, Burrows-Wheeler transform, Lempel and Ziv, 1977 (LZ77) algorithm, Lempel-Ziv-Welch (LZW) algorithm, Huffman coding or arithmetic coding. Using generic compression techniques on the zero or more compressed format modules enables further compression of data file 110. Pursuant to this embodiment, the zero or more generically compressed format modules and rest of the plurality of compressed format modules are then combined sequentially at step 315 to obtain the compressed data file in the same sequence as data file 110.

Figure 4:
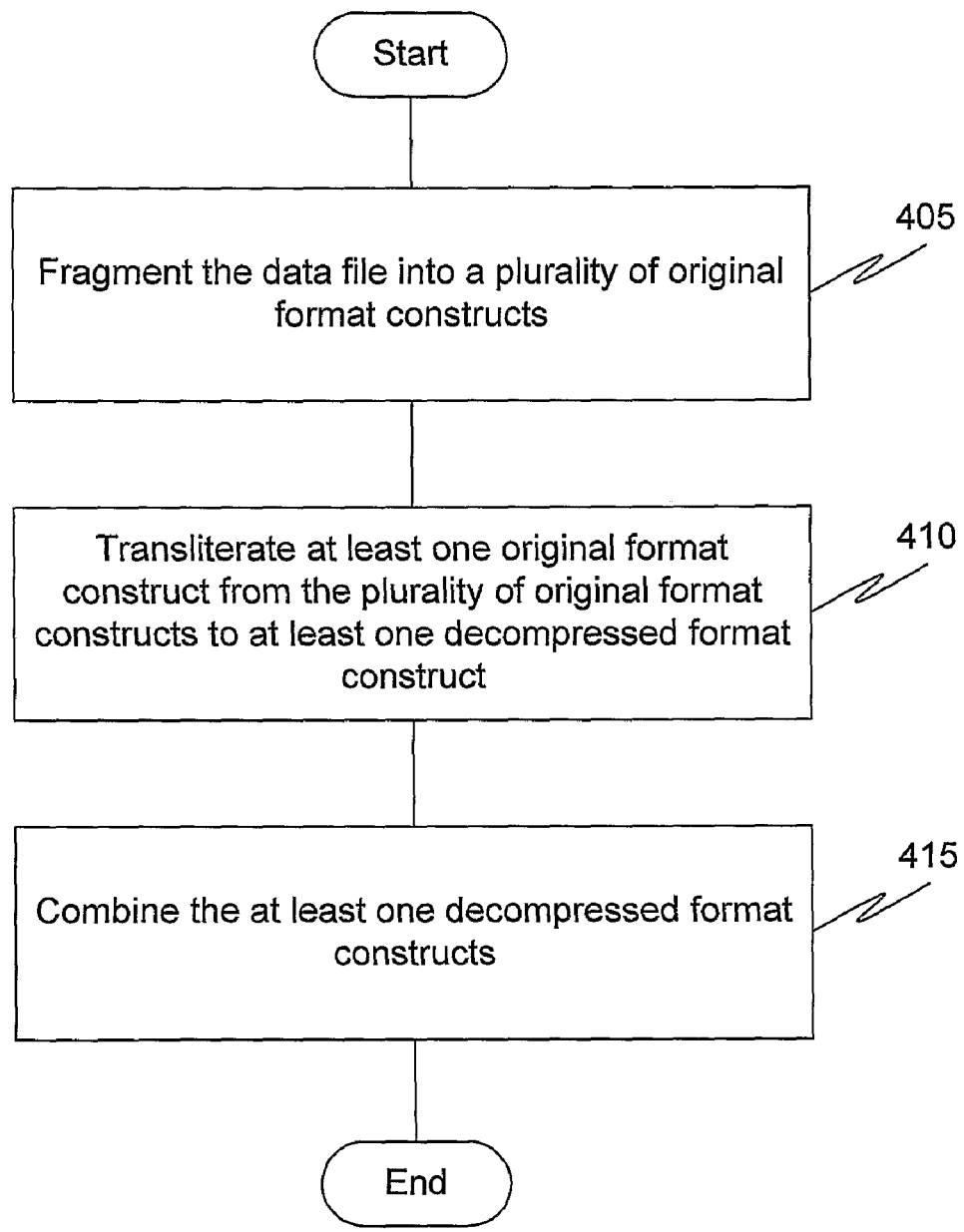
FIG. 4 illustrates a flow diagram for a method of decompressing a data file using a transliteration procedure in accordance with an embodiment of the present invention.

Turning now to FIG. 4, a flow diagram for a method of decompressing a data file using a transliteration procedure is shown in accordance with an embodiment of the present invention. As described in FIG. 2, in an embodiment of the present invention, data file 110 is decompressed using the transliteration procedure to obtain a decompressed data file in a decompressed format at step 220. It will be appreciated by those skilled in the art that data file 110 can already be a compressed data file. Therefore, in this case, the original format can be the compressed format and the decompressed format can be, but is not limited to, a Graphic Design System II (GDSII), Open Artwork System Interchange Standard (OASIS), Manufacturing Electron Beam Engraving System (MEBES), JEOL, Hitachi Language (HL), Variable Shaped Beam-11/12 (VSB-11/12) or Open Artwork System Interchange Standard-Variable Shaped Beam (OASIS-VSB).

Moreover, in accordance with the embodiment depicted in FIG. 4, data file 110 can be the compressed data file obtained in FIG. 3.

For decompression, data file 110, which is in an original format, is fragmented into a plurality of original format constructs at step 405. In an embodiment of the present invention, the plurality of original format constructs can be a plurality of original format modules. As mentioned earlier, the granularity of the plurality of original format modules can be an implementation decision. Generally, a module represents a smallest unit of data that can be accessed randomly during decompression of the data. If data file 110 is the compressed data file of FIG. 3, then data file 110 is fragmented such that the plurality of original format modules are in the same sequence as they appear in the compressed data file as mentioned in conjunction with FIG. 3. Any global data outside the plurality of original format modules are passed as globals, such as a header or other information. This global data stored in Trailer information can be used for selective decompression and random access and direct reading of the data in data file 110.

In an embodiment of the present invention, where data file 110 is already compressed, data file 110 can comprise one or more generically compressed format modules. The one or more generically compressed format modules may have been compressed using generic compression procedures, as mentioned earlier in conjunction with an embodiment of FIG. 3. These one or more generically compressed format modules can be decompressed using a generic decompression procedure to obtain the one or more compressed format modules mentioned in conjunction with FIG. 3. The one or more compressed format modules can be referred to as generically decompressed format modules, since the one or more compressed format modules, mentioned in conjunction with an embodiment of FIG. 3, are obtained by generically decompressing the one or more generically compressed format modules, mentioned in conjunction with this embodiment of FIG. 4. The generic decompression procedure corresponds to the generic compression procedure used for compression. The global data can also be decompressed using the generic decompression procedure. Pursuant to this embodiment, the generically decompressed format modules can, then, be passed on to the next stage for decompression using the transliteration procedure.

The plurality of original format modules can, now, be segregated to obtain a plurality of original format elements. Generally, an element represents a smallest unit of data that can be decompressed during decompression. Those skilled in the art will appreciate that the granularity of the plurality of original format elements can be an implementation decision. However, usually a layout or a mask data file has easily identifiable units as original format elements. For example, in case of GDSII, an original format element can be an element that fully defines an individual polygon.

In an embodiment of the present invention, each of the plurality of original format constructs (including the generically decompressed format modules, if any), either modules or elements, is passed on to the next stage for transliteration. In another embodiment of the present invention, the plurality of original format constructs are filtered to obtain a selected set of original format constructs, which are passed on to the next stage for transliteration. The selected set of original format constructs can be selected from the plurality of original format constructs based on one or more predetermined criterion. The one or more predetermined criterion can comprise filtering out a specific layer of data file 110, selecting a specific original format construct, resizing of one or more geometric data in data file 110 and eliminating at least one self-intersecting geometric data in data file 110. In an embodiment of the present invention, data file 110 can be filtered using complex filters configured for resizing of polygons or eliminating self-intersecting polygons. Filtering the plurality of original format constructs provides a capability of selective lossless decompression to the present invention. However, those skilled in the art will appreciate that if a global data is filtered out, the decompression may not be lossless as some important information may be lost along with the global data.

At step 410, the plurality of original format constructs or only the selected set of original format constructs is transliterated to obtain one or more decompressed format constructs. The one or more decompressed format constructs can be a decompressed format module or a decompressed format element. If the one or more decompressed format constructs are decompressed format elements, the decompressed format elements are collected sequentially to form one or more decompressed format modules. At step 415, one or more decompressed format constructs are combined sequentially to obtain the decompressed data file.

It will be appreciated by those skilled in the art that the transliteration procedure for compression of data file 110 as described in conjunction with FIG. 3, and the transliteration procedure for decompression of data file 110 as described in conjunction with FIG. 4 are very similar. The only difference in the compression method and the decompression method is the introduction of the generic compression procedure after the transliteration procedure in the compression method and the introduction of the generic decompression procedure before the transliteration procedure in the decompression method. The architecture of the compression method of FIG. 3 and the decompression method of FIG. 4 can be based on the concept of pipes, where each step is concerned with a current state of data, rather than about where the data came from and about where the data is destined for.

Figure 5:
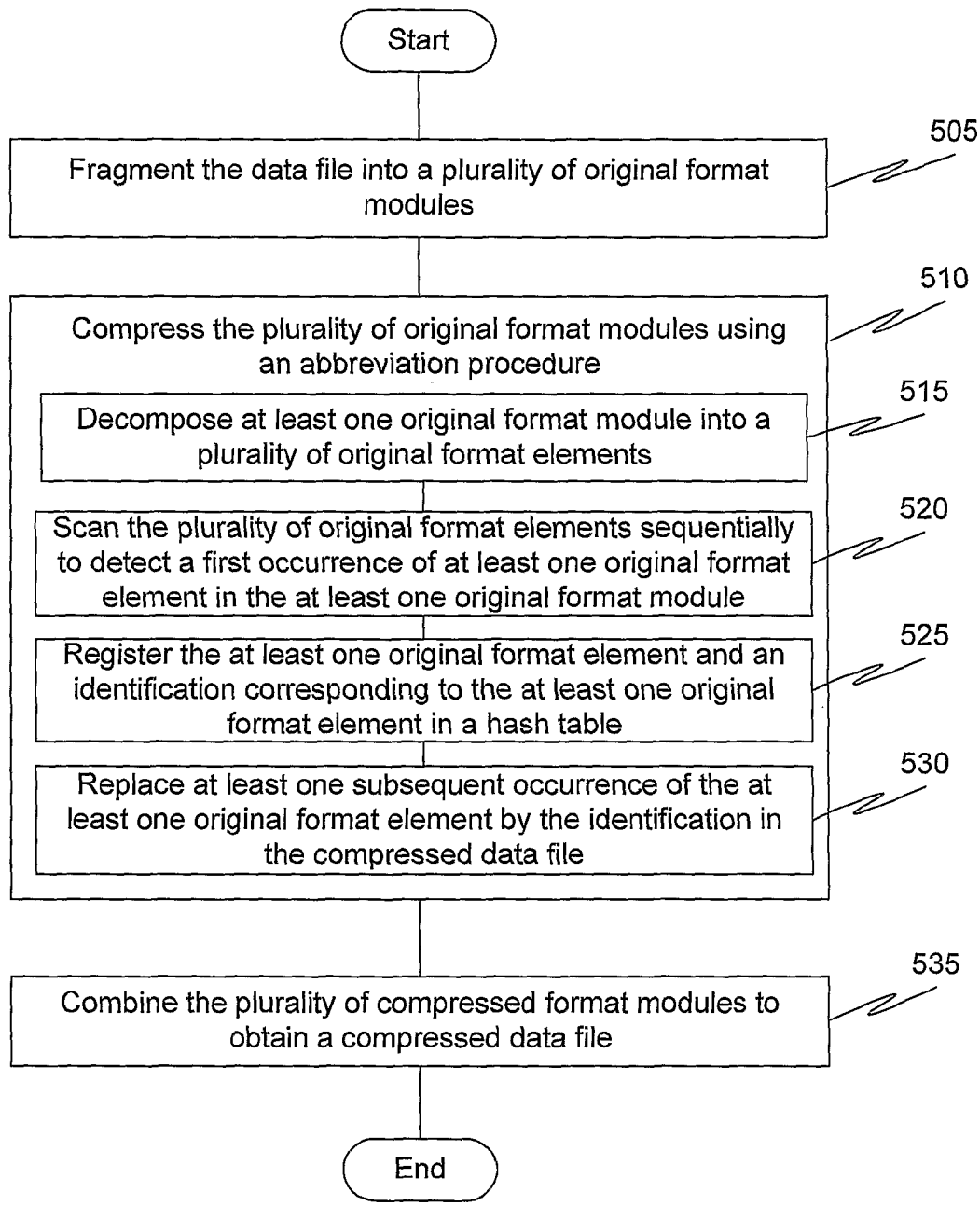
FIG. 5 illustrates a flow diagram for a method of managing the data file size corresponding to the data file using an abbreviation procedure in accordance with an embodiment of the present invention.

Turning now to FIG. 5, a flow diagram for a method of managing the data file size corresponding to the data file using an abbreviation procedure is shown in accordance with an embodiment of the present invention. The method comprises creating specific abbreviations for frequently used elements, such as congruent polygons, paths or strings, and storing the abbreviations in hash tables. A compressed data file corresponding to the data file has references to these abbreviations whenever the frequently used polygons appear in the data file.

In an embodiment of the present invention, the method identifies congruent geometries in the geometrical data and applies explicit abbreviation to it. In another embodiment of the present invention, the method enables implicit abbreviation. Implicit abbreviation is achieved through modality, which is commonly known in the art.

Referring back to FIG. 5, the data file is fragmented into a plurality of original format modules at step 505, as described earlier. At step 510, the plurality of original format modules is compressed using an abbreviation procedure to obtain a plurality of compressed format modules. The abbreviation procedure comprises decomposing one or more original format modules into a plurality of original format elements at step 515. The plurality of original format elements are, then, scanned sequentially at step 520. While scanning an original format module, a first occurrence of one or more original format elements is detected. An original format element is registered in a hash table and an identification corresponding to that original format element is stored in the hash table at step 525. When a subsequent occurrence of the original format element is encountered in an original format module, the identification of the original format element is retrieved from the hash table. The subsequent occurrences of the original format element are then replaced by the retrieved identification at step 530. For implicit abbreviation, if consecutive original format elements are similar, then the identification also need not be stored. Only the original format element, where it first occurs in the original format module, is stored. Such data files, which have similar consecutive elements, are known to be modal in nature. For modal elements, it is sufficient if the elements are re-specified only when their values change.

Those skilled in the art will realize that the abbreviation procedure can be done for a plurality of original format elements that have multiple occurrences in an original format module. In an embodiment of the present invention, only a set of original format elements with a frequency of occurrence greater than a predetermined number is stored in the hash table.

An example illustrating an implicit abbreviation of a data file which is in a GDSII format is given below. For instance, records in two consecutive GDSII elements may have similar data, that is, they may be modal. Every record in GDSII format, except XY records, can potentially be compressed utilizing modal properties. A standard format of GDSII boundary element is given by:

<boundary>::=BOUNDARY[ELFLAGS][PLEX] LAYER DATATYPE XY<property>

For example, the data file can be in a GDSII format and can have the following boundary elements:

BOUNDARY 100 2 XY
BOUNDARY 100 3 XY
BOUNDARY 100 3 XY

In accordance with the abbreviation procedure, the first boundary element, BOUNDARY 100 2 XY, is stored as it is. While storing the next boundary element, the layer (100) is not stored as it is repeated (modal in nature). For the third boundary element both layer and datatype are not stored because the layer and the datatype are same as the previous boundary element layer and datatype.

Therefore, the following is obtained after compressing these boundary elements using modal properties:

BOUNDARY 100 2 XY
BOUNDARY 3 XY
BOUNDARY XY

In an embodiment of the present invention, a geometric hashing technique is used. Geometric hashing can be based on explicit abbreviation, for example, using a hash table. Geometric hashing technique enables storing congruent polygons compactly. Only the polygons with the frequency of occurrence greater than a predetermined number are stored in a hash table. Those skilled in the art will realize that in a real-world scenario, a large number of polygons are congruent, and hence, the geometric hashing technique provides high compression.

At step 535, the plurality of compressed format modules are combined to obtain a compressed data file. The hash table is stored as a part of the compressed data file. The hash table can be of various type, for instance, for data file in GDSII format, the hash table can be a string table for storing all kinds of strings, a layer-datatype table for storing unique pairs of <layer, datatype/nodetype/texttype/boxtype> or a strans table for storing unique values of strans records. The hash table is utilized while decompressing the compressed data file. The decompression of the compressed data file using the abbreviation procedure is described in detail in conjunction with FIG. 6.

Figure 6:
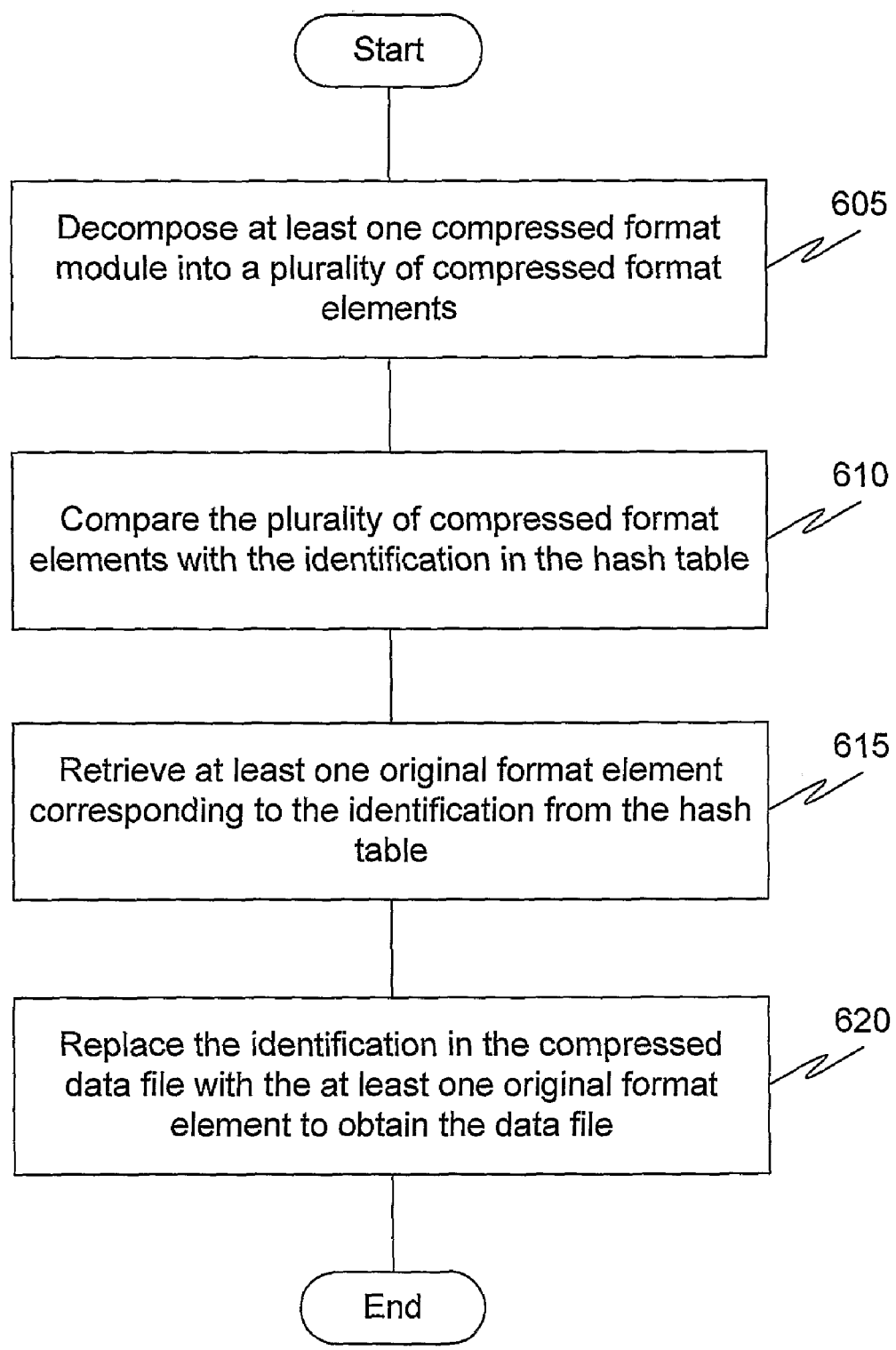
FIG. 6 illustrates a flow diagram of a method for decompressing a compressed data file using an abbreviation procedure in accordance with an embodiment of the present invention.

Turning now to FIG. 6, a flow diagram of a method for decompressing a compressed data file using an abbreviation procedure is shown in accordance with an embodiment of the present invention. As described in FIG. 5, a data file is compressed using the abbreviation procedure to obtain a compressed data file. The compressed data file can be decompressed using the hash table to obtain back the data file.

The compressed data file is decomposed to obtain a plurality of compressed format modules. One or more compressed format modules are, further, decomposed into a plurality of compressed format elements at step 605. At step 610, each of the plurality of compressed format elements is compared with the identifications in the hash table. If a match in a compressed format element and an identification in the hash table is found, an original format element corresponding to the identification is retrieved from the hash table at step 615. The compressed format element is, then, replaced with the original format element corresponding to the identification at step 620. This is done for the plurality of compressed format modules. Upon decompressing the plurality of compressed format modules, a plurality of original format modules is obtained. These plurality of original format modules are combined to obtain back the original data file.

Figure 7:
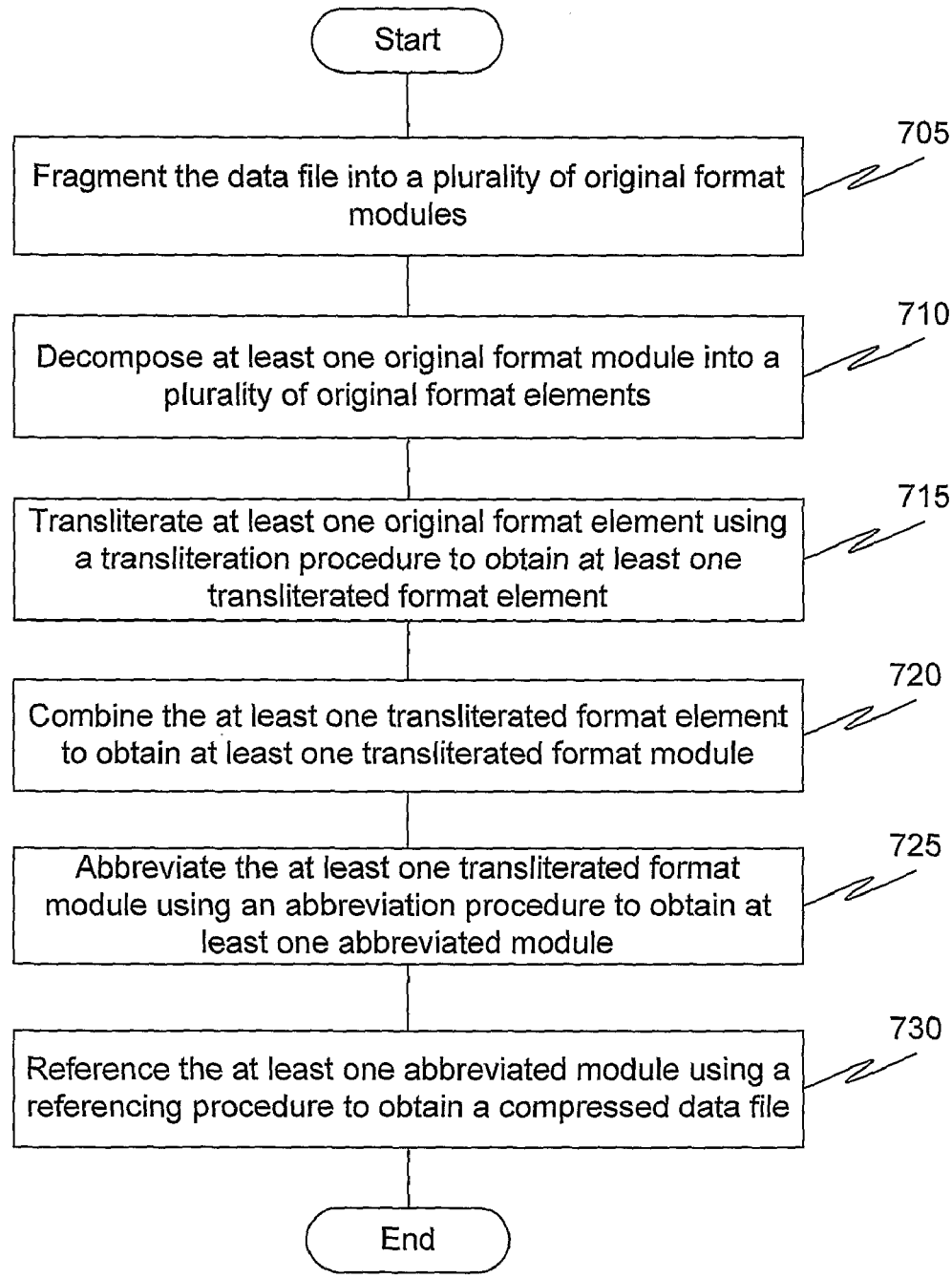
FIG. 7 illustrates a flow diagram for managing a data file size corresponding to a data file in accordance with an embodiment of the present invention.

Turning now to FIG. 7, a flow diagram for managing a data file size corresponding to a data file is shown in accordance with an embodiment of the present invention. This method combines at least two of the transliteration procedure, the abbreviation procedure and a referencing procedure. The referencing procedure is described in conjunction with FIG. 8.

The data file is fragmented into a plurality of original format modules at step 705. The method of fragmenting the data file into a plurality of original format modules is already described earlier. In an embodiment of the present invention, one or more original format modules from the plurality of original format modules are selected to be passed on to the next stage of compression, as described in conjunction with FIG. 3. The one or more original format modules are, further, decomposed into a plurality of original format elements at step 710. As described earlier, one or more original format elements from the plurality of original format modules can be selected for compression. The one or more original format elements are transliterated at step 715 using the transliteration procedure described in conjunction with FIG. 3 to obtain one or more transliterated format elements. A transliterated format element is in a transliterated format, which can be constructed like the compressed format as described in conjunction with FIG. 3. The one or more transliterated format elements are, then, combined at step 720 to obtain one or more transliterated format modules.

Further, the one or more transliterated format modules are abbreviated using the abbreviation procedure at step 725 to obtain one or more abbreviated modules. The abbreviation procedure is described in conjunction with FIG. 5. The one or more abbreviated modules are then referenced using the referencing procedure at step 730 to obtain the compressed data file.

Those with ordinary skill in the art will appreciate that a data file compressed using the transliteration procedure, the abbreviation procedure and the referencing procedure can result in a better compression than that data file being compressed using any of the three compressions individually.

In an embodiment of the present invention, the data file is compressed using only the transliteration procedure and the referencing procedure. In another embodiment of the present invention, the data file is compressed using only the transliteration procedure and the abbreviation procedure. In yet another embodiment of the present invention, the data file is compressed using only the abbreviation procedure and the referencing procedure. Further, the data file can be compressed using any two of the transliteration procedure, the abbreviation procedure and the referencing procedure in a parallel manner, which is transliteration, abbreviation and referencing of the one or more original format elements can happen simultaneously. In another embodiment of the present invention, the data file can be compressed using the transliteration procedure, the referencing procedure and the abbreviation procedure in a given sequence.

Figure 8:
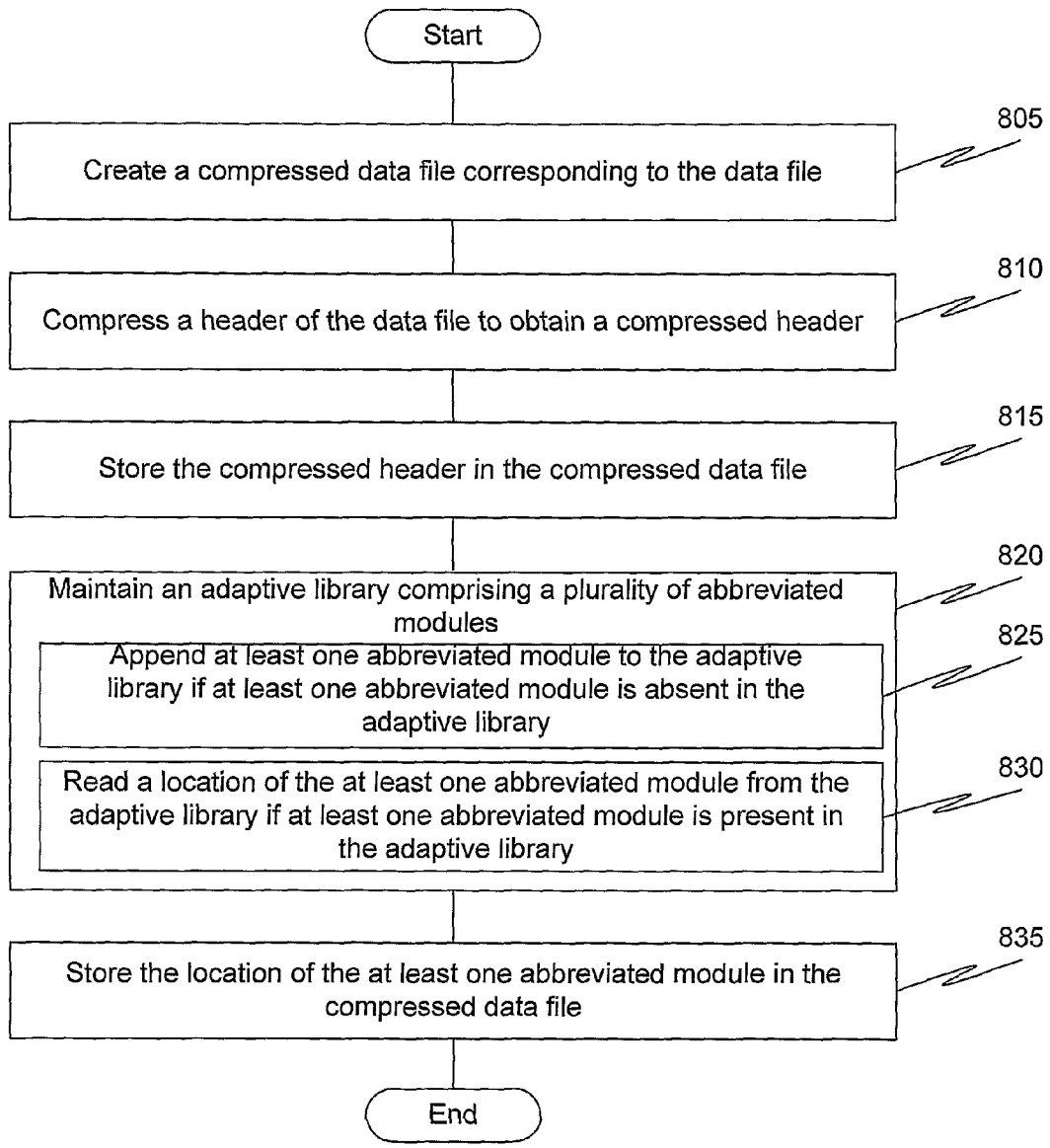
FIG. 8 illustrates a flow diagram depicting a referencing procedure for compression of a data file in accordance with an embodiment of the present invention.

Turning now to FIG. 8, a flow diagram depicting a referencing procedure for compression of a data file is shown in accordance with an embodiment of the present invention. A concept of an adaptive library is used in the referencing procedure for compressing the data file. The adaptive library is, basically, a file or a set of files that contain one or more original format modules or one or more abbreviated modules and/or one or more transliterated format modules corresponding to the data file. It will be appreciated by those of ordinary skill in the art that upon compressing a data file using the transliteration procedure or the abbreviation procedure or both as described in conjunction with FIG. 7, the resulting data file can comprise some original format modules, some transliterated format modules, some abbreviated modules and some transliterated format modules that are abbreviated. The adaptive library can contain all such modules.

The referencing procedure comprises creating a compressed data file corresponding to the data file at step 805. A header of the data file is compressed to obtain a compressed header at step 810. The header can be compressed based on the transliteration procedure. The compressed header is then stored in the compressed data file at step 815. The adaptive library associated with the data file is maintained at step 820. As mentioned earlier, the adaptive library can comprise a plurality of abbreviated modules mentioned in conjunction with FIG. 7.

For maintaining the adaptive library, it is checked if an abbreviated module is present in the adaptive library. If the abbreviated module is absent in the adaptive library, the abbreviated module is appended to the adaptive library at step 825. This can be done for all of the plurality of abbreviated modules. Moreover, step 825 is also applicable if the data file has some original format modules or transliterated format modules.

Further, if the abbreviated module is present in the adaptive library, the location of the abbreviated module is read from the adaptive library at step 830. Upon reading the location of the abbreviated module from the adaptive library, the location is stored in the compressed data file at step 835. This can be done for all of the plurality of abbreviated modules. Thus, instead of storing the plurality of abbreviated modules, only the locations of the plurality of abbreviated modules are stored in the compressed data file. This enables in generating a very small compressed data file as the compressed data file contains only references to the abbreviated modules in the adaptive library. The compressed data file may not contain any geometrical data of its own and hence, the size of the compressed data file is usually small as compared to the size of the data file.

The referencing procedure is based on an adaptive technique, for instance using the adaptive library. Those skilled in the art will realize that the compression obtained by this adaptive technique depends on the number of data files being compressed. For a first data file, the referencing procedure may not get any additional compression. However, the referencing procedure is more efficient if more number of data files are getting compressed and if the content of some of their abbreviated modules is the same.

Figure 9A:
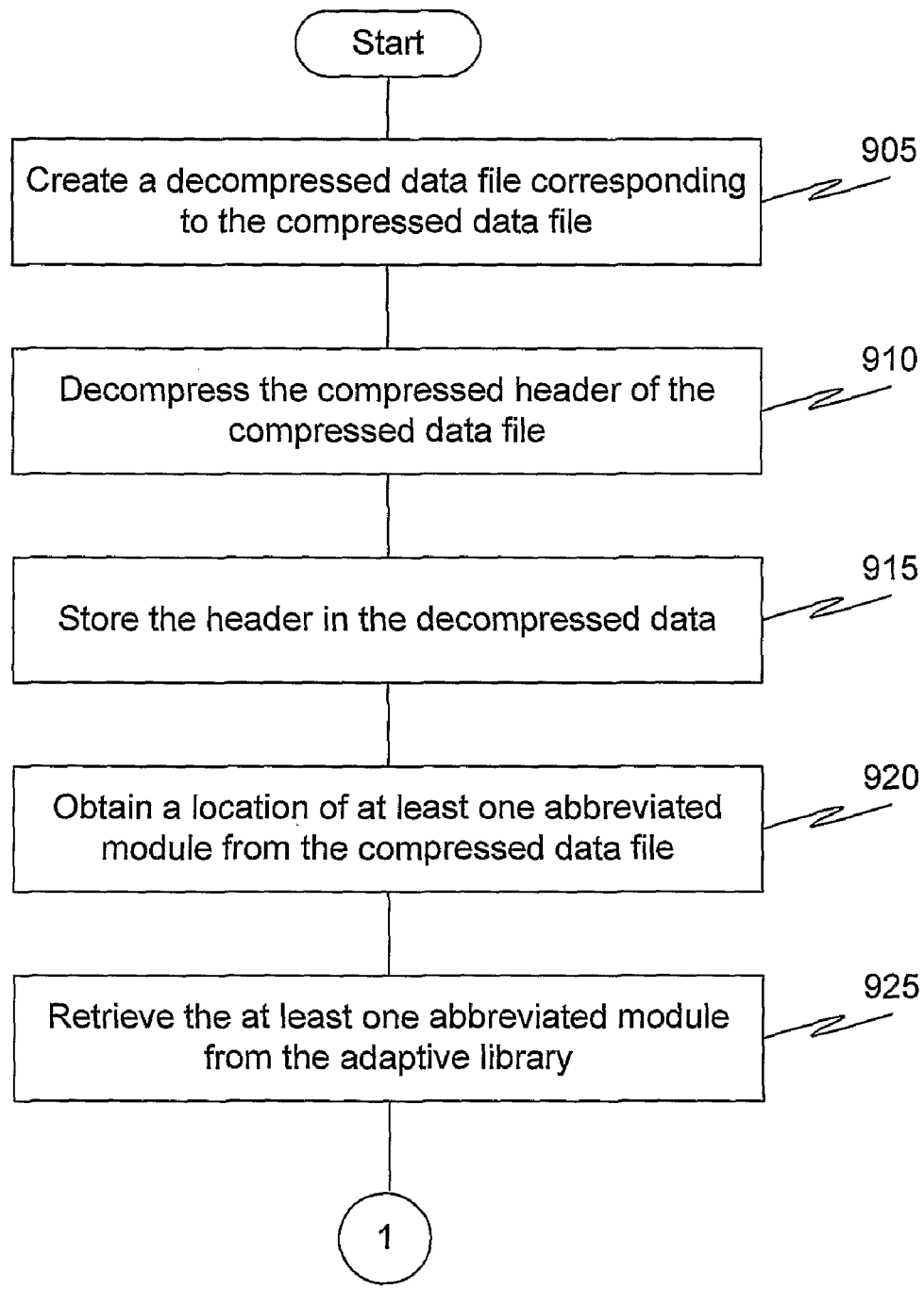
FIGS. 9A and 9B illustrate a flow diagram depicting a referencing procedure for decompression of a data file in accordance with an embodiment of the present invention.
Figure 9B:
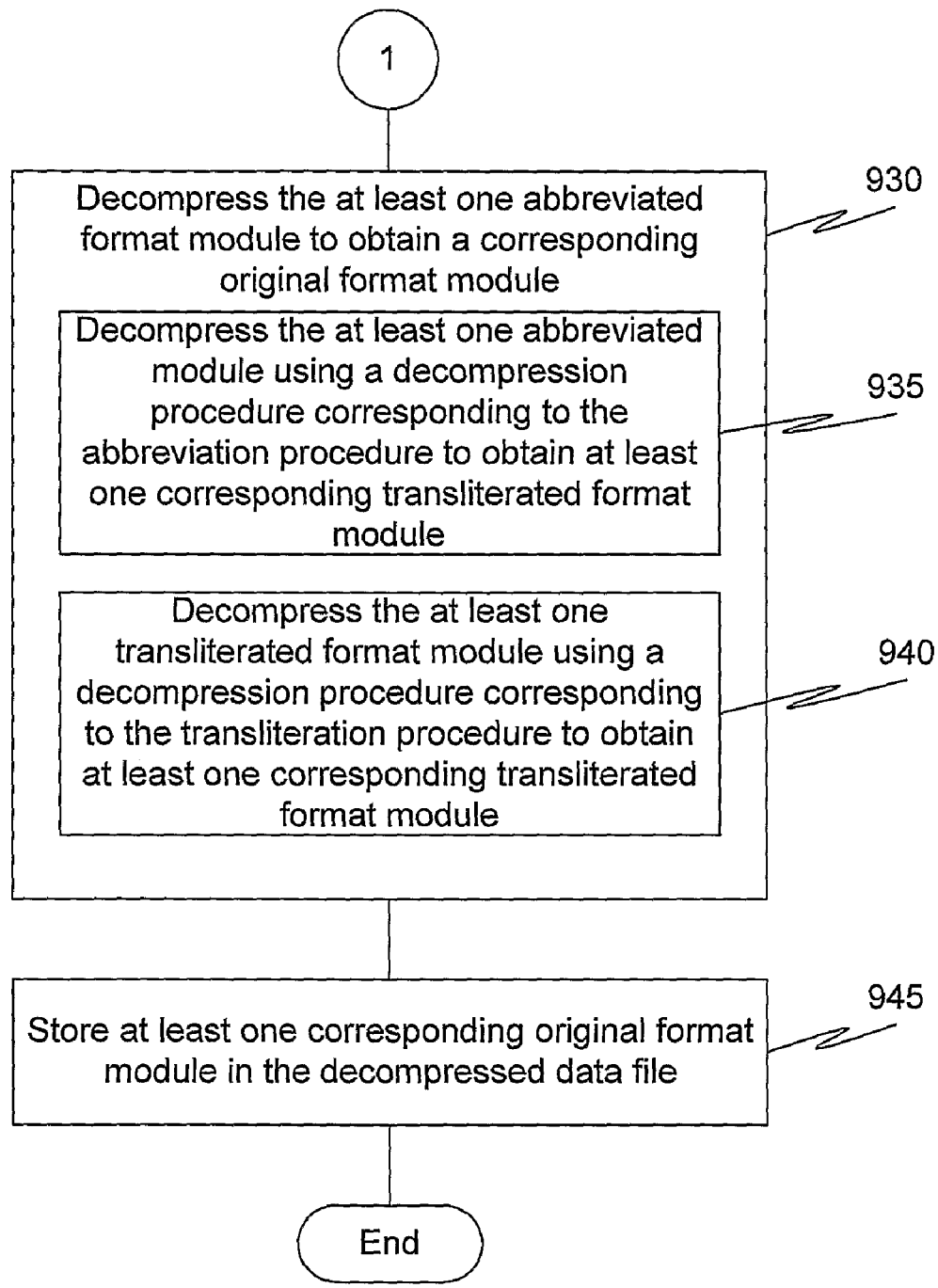

Turning now to FIGS. 9A and 9B, a flow diagram depicting a referencing procedure for decompression of a data file is shown in accordance with an embodiment of the present invention. The compressed data file obtained using the referencing procedure, described in conjunction with FIG. 8, can be decompressed by the method described in FIGS. 9A and 9B to obtain a decompressed data file. Those with ordinary skill in the art will realize that the decompressed data file is the same as the data file.

For decompressing the compressed data file, a decompressed data file is created corresponding to the compressed data file at step 905. A compressed header of the compressed data file is decompressed at step 910 to obtain the header of the data file. If the compressed header is compressed using the transliteration procedure, the compressed header is decompressed using a decompression method corresponding to the transliteration procedure. The decompression method corresponding to the transliteration procedure is described in detail in conjunction with FIG. 4. Thereafter, the header is stored in the decompressed data file at step 915.

As mentioned above, the compressed data file has references to one or more abbreviated modules. The location of the one or more abbreviated modules is obtained from the compressed data file at step 920. The one or more abbreviated modules are, then, retrieved from an adaptive library corresponding to the compressed data file at step 925.

The one or more abbreviated modules are decompressed to obtain one or more original format modules at step 930. The decompressing step, step 930, comprises decompressing the one or more abbreviated modules using a decompression procedure corresponding to the abbreviation procedure at step 935 to obtain one or more transliterated format modules. The decompression procedure corresponding to the abbreviation procedure is described in conjunction with FIG. 6. As mentioned above, the compressed data file can comprise some original format modules, some transliterated format modules, some abbreviated modules and some transliterated format modules that are further abbreviated. The abbreviated modules and the transliterated format modules that are abbreviated are decompressed at step 935.

The one or more transliterated format modules are decompressed at step 940 using a decompression procedure corresponding to the transliteration procedure. Decompression using the transliteration procedure is described in detail in conjunction with FIG. 4. Upon decompressing the one or more transliterated format modules, one or more original format modules are obtained. All the original format modules are stored in the decompressed data file at step 945. This decompressed data file is same as the data file that was compressed using the method described in conjunction with FIG. 8

Figure 10:
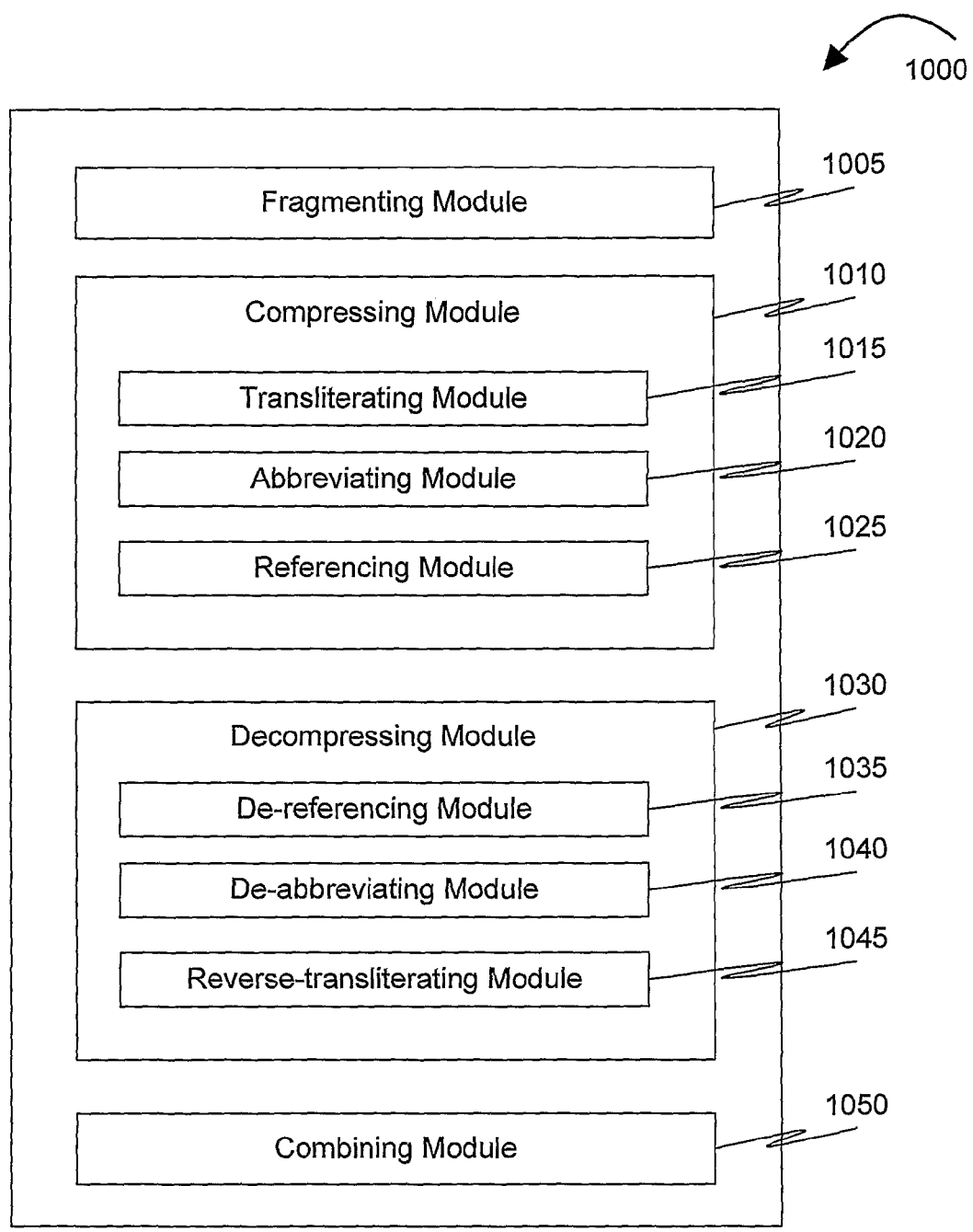
FIG. 10 illustrates a block diagram of a system for managing a size of a data file in accordance with an embodiment of the present invention.

Turning now to FIG. 10, a block diagram of a system 1000 for managing a size of a data file is shown in accordance with an embodiment of the present invention. The data file can comprise one or more geometrical data in an original format. System 1000 can be a software program coupled with hardware components.

System 1000 comprises a fragmenting module 1005. Fragmenting module 1005 is configured to fragment the data file into a plurality of original format modules. Fragmenting module 1005 can then decompose one or more original format modules into a plurality of original format elements. The process of fragmenting and decomposing are described in detail earlier.

System 1000 further comprises a compressing module 1010 for compressing the data file. Compressing module 1010 comprises at least one of a transliterating module 1015 and an abbreviating module 1020. Thus, in an embodiment of the present invention, compressing module 1010 comprises only transliterating module 1015 In another embodiment of the present invention compressing module 1010 comprises only abbreviating module 1020. In yet another embodiment of the present invention, compressing module 1010 comprises both, transliterating module 1015 and abbreviating module 1020. In this embodiment abbreviating module 1020 can be coupled to transliterating module 1015 such that an output data of transliterating module 1020 can be an input data to abbreviating module 1020.

Transliterating module 1015 is configured for transliterating one or more original format elements form the plurality of original format elements to obtain one or more transliterated format elements using a transliteration procedure. The transliteration procedure is described in detail in conjunction with FIG. 3. Transliterating module 1015, then, combines the one or more transliterated format elements to obtain one or more one transliterated format modules corresponding to the one or more original format modules.

Abbreviating module 1020 is configured for abbreviating the one or more transliterated format modules using an abbreviation procedure to obtain one or more abbreviated modules, as described in conjunction with FIG. 5. Abbreviating module 1020 decomposes the one or more transliterated format modules into a plurality of transliterated format elements. Abbreviating module 1020 then scans the plurality of transliterated format elements sequentially. While scanning, abbreviating module 1020 may detect a first occurrence of one or more transliterated format elements in the one or more transliterated format modules. Abbreviating module 1020 registers the one or more transliterated format elements that are encountered for the first time while scanning. Also, identifications corresponding to the one or more transliterated format elements are stored in a hash table. Abbreviating module 1020, then, replaces one or more subsequent occurrences of the one or more transliterated format elements with the identifications in the one or more abbreviated modules. Those skilled in the art will realize that replacing the one or more transliterated format elements with their identifications results in an efficient compression.

Compressing module 1010 can also comprise a referencing module 1025 for referencing the one or more abbreviated modules using a referencing procedure. The referencing procedure is described in conjunction with FIG. 8.

In an embodiment of the present invention, system 1000 can also comprise a decompressing module 1030 for decompressing a compressed data file. Decompressing module 1030 is configured for decompressing a compressed data file. Decompressing module 1030 may comprise a de-referencing module 1035. De-referencing module 1035 is configured for decompressing a compressed data file, which is compressed using at least the referencing procedure. De-referencing module 1035 first creates a decompressed data file corresponding to the compressed data file. Further, de-referencing module 1035 decompresses the compressed header of the compressed data file to obtain the header based on the transliteration procedure. The header is, then, stored in the decompressed data file. De-referencing module 1035 is further configured for obtaining locations of one or more abbreviated modules from the compressed data file. If the compressed data file comprises other modules, such as one or more transliterated format modules or one or more original format modules, de-referencing module 1035 can also obtain locations corresponding to them. The one or more abbreviated modules or the one or more transliterated format modules or the one or more original format modules can be retrieved from the adaptive library based on the locations.

Decompressing module 1030 can further comprise a de-abbreviating module 1040. De-abbreviating module 1040 is configured for decompressing the one or more abbreviated modules. De-abbreviating module 1040 decompresses the one or more abbreviated modules using a decompression procedure corresponding to the abbreviation procedure to obtain one or more corresponding transliterated format modules. If the transliteration procedure is not used to compress the one or more abbreviated modules, de-abbreviating module 1040 can decompresses the one or more abbreviated modules to obtain one or more corresponding original format modules. The decompression procedure corresponding to the abbreviation procedure is described in detail in conjunction with FIG. 6.

Decompressing module 1030 can further comprise a reverse-transliterating module 1045. Reverse-transliterating module 1045 is configured for decompressing the one or more transliterated modules. Reverse-transliterating module 1045 performs decompression on the one or more transliterated format modules using a decompression procedure corresponding to the transliteration procedure to obtain one or more corresponding original format modules. Those with ordinary skill in the art will note that the one or more original format modules stated herein are the equivalent to the one or more decompressed format modules mentioned in conjunction with FIG. 4. The decompression procedure corresponding to the transliteration procedure is described in detail in conjunction with FIG. 4.

System 1000 further comprises a combining module 1050. Combining module 1050 is configured for combining one or more original format constructs to obtain back the original data file. As mentioned earlier, the one or more original format constructs can be one or more original format elements or one or more original format modules. Combining module 1050 can combine the one or more original format elements to form at least one original format module. Further, combining module 1050 can combined the one or more original format modules to obtain back the original data file. Moreover, combining module 1050 is also configured for combining one or more transliterated format constructs, one or more abbreviated modules or one or more compressed format constructs to obtain a compressed data file.

An embodiment of the present invention has a computer program product comprising a computer usable medium having a computer readable program for managing a data file size corresponding to a data file. The data file can comprise at least one geometrical data in an original format. When the computer readable program is executed on a computer, it causes the computer to perform at least one of the transliteration procedure, the abbreviation procedure and the referencing procedure on the data file to obtain a compressed data file.

Further, the computer program product also causes the computer to decompress a compressed data file based on at least one of the transliteration procedure, the abbreviation procedure and the referencing procedure to obtain back the data file in the original format.

The various embodiments of the present invention provide a method and system for manipulating size of a data file size by compressing or decompressing the data file. Reduction of size of a data file has numerous advantages. For instance, by manipulating the data file size, the time for transferring the data file can be reduced. Also, the storage space required for storing and archiving the data file is lowered. Further, the compression and decompression methods described in the present invention can directly accept compressed layout or mask data.

Moreover, the present invention provides a selective module-wise compression of the layout or mask data file. The present invention also provides compressed layout data to be selectively de-compressed. This additional capability provided by the present invention makes it easier to introduce value-added data manipulation during the compression and decompression processes. Apart from this, it also allows various operations to be carried out directly on the compressed data.

Further, the present invention provides on-the-spot verification to check correctness of a compressed data file. By checking the correctness of the compressed data file, the data file can be exactly recovered back from the compressed data file. Also, the present invention provides a technique of generating a library of compressed data files such that the compressed data files can be shared and re-used by different compressed layout or mask data files.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method of managing a data file size corresponding to a data file, wherein the data file comprises at least one geometrical data in an original format, the method comprising:
   fragmenting the data file into a plurality of original format modules;
   compressing the plurality of original format modules to obtain a corresponding plurality of compressed modules using at least one of:
   a transliterating procedure, the transliterating procedure comprises:
     transliterating at least one original format element from the plurality of original format elements to obtain at least one transliterated format element, wherein a transliteration procedure is used for transliterating; and
     combining the at least on transliterated format element to obtain at least one transliterated format module corresponding to the at least one original format module;
   an abbreviation procedure to abbreviate the at least one transliterated format module to obtain at least one abbreviated module, the abbreviation procedure comprises:
     decomposing at least one original format module into a plurality of original format elements;
     scanning the plurality of original format elements sequentially, wherein the scanning step comprises detecting a first occurrence of at least one original format element in the at least one original format module;
     registering the at least one original format element and an identification corresponding to the at least one original format element in a hash table; and replacing at least one subsequent occurrence of the at least one original format element by the identification in the compressed data file; and a referencing procedure to reference the at least one abbreviated module to obtain the corresponding plurality of compressed modules, the referencing procedure comprises;

creating the corresponding plurality of compressed modules corresponding to the data file;

compressing a header of the data file to obtain a compressed header, wherein the compressing step is based on the transliteration procedure;

storing the compressed header in the corresponding plurality of compressed modules; and maintaining an adaptive library comprising a plurality of abbreviated modules, the plurality of abbreviated modules corresponding to the data file, the maintaining step comprising:

appending at least one abbreviated module to the adaptive library, if at least one abbreviated module is absent in the adaptive library;

reading a location of the at least one abbreviated module from the adaptive library, if the at least one abbreviated module is present in the adaptive library; and storing the location of the at least one abbreviated module in the corresponding plurality of compressed modules;

combining the plurality of compressed format modules to obtain a compressed data file, the compressed data file being in a compressed format, wherein a compressed data file size of the compressed data file is less than or equal to a data file size of the data file; and decompressing the plurality of compressed format modules using a decompressing procedure to obtain a decompressed data file, wherein the decompressing procedure comprises at least one of:

a de-referencing procedure comprising:

creating the decompressed data file corresponding to the compressed data file;

decompressing the compressed header of the compressed data file to obtain the header based on the transliteration procedure;

storing the header in the decompressed data file;

obtaining a location of at least one abbreviated module from the compressed data file; and retrieving the at least one abbreviated module from the adaptive library based on the location;

decompressing the at least one abbreviated module using a decompression procedure corresponding to the abbreviation procedure to obtain at least one corresponding transliterated format module;

decompressing the at least one transliterated format module using a decompression procedure corresponding to the transliteration procedure to obtain at least one corresponding original format module; and storing the at least one corresponding original format module in the decompressed data file.

2. The method of claim 1, wherein at least one set of original format elements with a frequency of occurrence greater than a predetermined number is stored in the hash table, the at least one set of original format elements belonging to the data file.

3. A method of managing a data file size corresponding to a data file, wherein the data file comprises at least one geometrical data in an original format, the method comprising:

fragmenting the data file into a plurality of original format modules;

decomposing at least one original format module into a plurality of original format elements;

transliterating at least one original format element from the plurality of original format elements using a transliteration procedure to obtain at least one transliterated format element, the at least one transliterated format element being in a transliterated format;

combining the at least one transliterated format element to obtain at least one transliterated format module corresponding to the at least one original format module;

abbreviating the at least one transliterated format module using an abbreviation procedure to obtain at least one abbreviated module, wherein the abbreviating step comprises:

decomposing the at least one transliterated format module into a plurality of transliterated format elements;

scanning the plurality of transliterated format elements sequentially, wherein the scanning step comprises detecting a first occurrence of at least one transliterated format element in the at least one transliterated format module;

registering the at least one transliterated format element and an identification corresponding to the at least one transliterated format element in a hash table; and replacing at least one subsequent occurrence of the at least one transliterated format element with the identification in the at least one abbreviated module;

referencing the at least one abbreviated module using a referencing procedure to obtain a compressed data file, wherein the referencing procedure comprises:

creating the compressed data file corresponding to the data file;

compressing a header of the data file to obtain a compressed header, wherein the compressing step is based on the transliteration procedure;

storing the compressed header in the compressed data file; and maintaining an adaptive library comprising a plurality of abbreviated modules, the plurality of abbreviated modules corresponding to the data file, the maintaining step comprising:

appending at least one abbreviated module to the adaptive library, if at least one abbreviated module is absent in the adaptive library;

reading a location of the at least one abbreviated module from the adaptive library, if the at least one abbreviated module is present in the adaptive library; and storing the location of the at least one abbreviated module in the compressed data file; and decompressing the compressed file using a decompressing procedure to obtain a decompressed data file, wherein the decompressing procedure comprises:

creating the decompressed data file corresponding to the compressed data file;

decompressing the compressed header of the compressed data file to obtain the header based on the transliteration procedure;

storing the header in the decompressed data file;

obtaining a location of at least one abbreviated module from the compressed data file;

retrieving the at least one abbreviated module from the adaptive library based on the location; and decompressing the at least one abbreviated module to obtain a corresponding original format module, the decompressing step comprising:
    decompressing the at least one abbreviated module using a decompression procedure corresponding to the abbreviation procedure to obtain at least one corresponding transliterated format module;
    decompressing the at least one transliterated format module using a decompression procedure corresponding to the transliteration procedure to obtain at least one corresponding original format module; and
    storing the at least one corresponding original format module in the decompressed data file.

4. A system for managing a data file size corresponding to a data file, wherein the data file comprises at least one geometrical data in an original format, the system comprising:
  memory; and
  a processor coupled to the memory, wherein the processor is configured to execute:
    a fragmenting module stored in the memory, the fragmenting module configured for:
      fragmenting the data file into a plurality of original format modules; and
      decomposing at least one original format module into a plurality of original format elements;
    a compressing module stored in the memory, the compressing module compressing the data file, the compressing module comprising at least one of:
      a transliterating module, the transliterating module configured for:
        transliterating at least one original format element from the plurality of original format elements to obtain at least one transliterated format element, wherein a transliteration procedure is used for transliterating; and
        combining the at least on transliterated format element to obtain at least one transliterated format module corresponding to the at least one original format module;
      an abbreviating module, the abbreviating module configured for abbreviating the at least one transliterated format module using an abbreviation procedure to obtain at least one abbreviated module, the abbreviating module is further configured for:
        decomposing the at least one transliterated format module into a plurality of transliterated format elements;
        scanning the plurality of transliterated format elements sequentially, wherein a first occurrence of at least one transliterated format element in the at least one transliterated format module is detected;
        registering the at least one transliterated format element and an identification corresponding to the at least one transliterated format element in a hash table; and
        replacing at least one subsequent occurrence of the at least one transliterated format element with the identification in the at least one abbreviated module in the compressed data file; and
      a referencing module, the referencing module configured for referencing the at least one abbreviated module using a referencing procedure to obtain a compressed data file, the referencing module further configured for:
        creating the compressed data file corresponding to the data file.
        compressing a header of the data file to obtain a compressed header, wherein the compressing step is based on the transliteration procedure;
        storing the compressed header in the compressed data file; and
        maintaining an adaptive library comprising a plurality of abbreviated modules, the plurality of abbreviated modules corresponding to the data file, the maintaining step comprising:
          appending at least one abbreviated module to the adaptive library, if at least one abbreviated module is absent in the adaptive library;
          reading a location of the at least one abbreviated module from the adaptive library, if the at least one abbreviated module is present in the adaptive library; and
          storing the location of the at least one abbreviated module in the compressed data file; and
  a decompressing module stored in the memory, the decompressing module decompressing the data file, the decompressing module comprising:
    a de-referencing module, the de-referencing module configured for:
      creating a decompressed data file corresponding to the compressed data file;
      decompressing the compressed header of the compressed data file to obtain the header based on the transliteration procedure;
      storing the header in the decompressed data file;
      obtaining a location of at least one abbreviated module from the compressed data file; and
      retrieving the at least one abbreviated module from the adaptive library based on the location;
    a de-abbreviating module, the de-abbreviating module decompressing the at least one abbreviated module using a decompression procedure corresponding to the abbreviation procedure to obtain at least one corresponding transliterated format module; and
    a reverse-transliterating module, the reverse-transliterating module decompressing the at least one transliterated format module using a decompression procedure corresponding to the transliteration procedure to obtain at least one corresponding original format module.

* * * * *